(12) United States Patent
Glenn

(10) Patent No.: US 12,194,870 B2
(45) Date of Patent: Jan. 14, 2025

(54) SYSTEMS AND METHODS FOR NON-OVERLAP ENFORCEMENT FOR INVERTER FOR ELECTRIC VEHICLE

(71) Applicant: Delphi Technologies IP Limited, St. Michael (BB)

(72) Inventor: Jack Lavern Glenn, Union Pier, MI (US)

(73) Assignee: Borg Warner US Technologies LLC, Wilmington, DE (US)

(*) Notice: Subject to any disclaimer, the term of this patent is extended or adjusted under 35 U.S.C. 154(b) by 191 days.

(21) Appl. No.: 18/163,381

(22) Filed: Feb. 2, 2023

(65) Prior Publication Data

US 2024/0106353 A1 Mar. 28, 2024

Related U.S. Application Data

(60) Provisional application No. 63/378,601, filed on Oct. 6, 2022, provisional application No. 63/377,501, filed
(Continued)

(51) Int. Cl.
*H02P 1/00* (2006.01)
*B60L 3/00* (2019.01)
(Continued)

(52) U.S. Cl.
CPC ............ *B60L 50/60* (2019.02); *B60L 3/003* (2013.01); *B60L 15/007* (2013.01); *B60L 15/08* (2013.01);
(Continued)

(58) Field of Classification Search
CPC ...... H02J 7/0063; H02M 1/08; H02M 7/5395; B60L 50/51; B60L 2210/42; H02P 27/08; H02P 27/06; H02P 29/024
See application file for complete search history.

(56) References Cited

U.S. PATENT DOCUMENTS 4,054,828 A 10/1977 Conzelmann et al.
4,128,801 A 12/1978 Gansert et al.
(Continued)

FOREIGN PATENT DOCUMENTS

WO 2007093598 A1 8/2007
WO 2011018835 A1 2/2011
(Continued)

OTHER PUBLICATIONS

Balogh, L., "Fundamentals of MOSFET and IGBT Gate Driver Circuits," Texas Instruments Application Report, SLUA618—Mar. 2017, Retrieved from internet URL: https://ghioni.faculty.polimi.it/pel/readmat/gate-drive.pdf, 65 pages.
(Continued)

*Primary Examiner* — Karen Masih
(74) *Attorney, Agent, or Firm* — Joshua M. Haines; Bookoff McAndrews, PLLC

(57) ABSTRACT

A system includes: an inverter including: a first galvanic interface to separate a first high voltage area from a low voltage area; a first low voltage controller in the low voltage area, the first low voltage controller configured to send a first control signal using the first galvanic interface to a first high voltage controller in the first high voltage area; a second galvanic interface to separate a second high voltage area from the low voltage area; and a second low voltage controller in the low voltage area, the first low voltage controller configured to send a second control signal using the second galvanic interface to a second high voltage controller in the second high voltage area, wherein the second low voltage controller is configured to provide an output latch signal to the first low voltage controller and receive an input latch signal from the first low voltage controller.

20 Claims, 8 Drawing Sheets

Related U.S. Application Data on Sep. 28, 2022, provisional application No. 63/377,512, filed on Sep. 28, 2022, provisional application No. 63/377,486, filed on Sep. 28, 2022.

(51) Int. Cl.

| | |
|---|---|
| *B60L 15/00* | (2006.01) |
| *B60L 15/08* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/22* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H01L 21/48* | (2006.01) |
| *H01L 23/00* | (2006.01) |
| *H01L 23/15* | (2006.01) |
| *H01L 23/367* | (2006.01) |
| *H01L 23/373* | (2006.01) |
| *H01L 23/40* | (2006.01) |
| *H01L 23/467* | (2006.01) |
| *H01L 23/473* | (2006.01) |
| *H01L 23/495* | (2006.01) |
| *H01L 23/538* | (2006.01) |
| *H01L 25/00* | (2006.01) |
| *H01L 25/07* | (2006.01) |
| *H01L 29/66* | (2006.01) |
| *H02J 7/00* | (2006.01) |
| *H02M 1/00* | (2006.01) |
| *H02M 1/08* | (2006.01) |
| *H02M 1/084* | (2006.01) |
| *H02M 1/088* | (2006.01) |
| *H02M 1/12* | (2006.01) |
| *H02M 1/32* | (2007.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5387* | (2007.01) |
| *H02M 7/5395* | (2006.01) |
| *H02P 27/06* | (2006.01) |
| *H02P 27/08* | (2006.01) |
| *H02P 29/024* | (2016.01) |
| *H02P 29/68* | (2016.01) |
| *H05K 1/14* | (2006.01) |
| *H05K 1/18* | (2006.01) |
| *H05K 5/02* | (2006.01) |
| *H05K 7/20* | (2006.01) |
| *B60L 15/20* | (2006.01) |
| *H03K 19/20* | (2006.01) |

(52) U.S. Cl.
CPC .............. *B60L 50/40* (2019.02); *B60L 50/51* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H01L 29/66553* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/06* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2049* (2013.01); *H05K 7/20854* (2013.01); *H05K 7/209* (2013.01); *H05K 7/20927* (2013.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(56) References Cited

U.S. PATENT DOCUMENTS

| | | | |
|---|---|---|---|
| 4,564,771 | A | 1/1986 | Flohrs |
| 4,618,875 | A | 10/1986 | Flohrs |
| 4,716,304 | A | 12/1987 | Fiebig et al. |
| 5,068,703 | A | 11/1991 | Conzelmann et al. |
| 5,432,371 | A | 7/1995 | Denner et al. |
| 5,559,661 | A | 9/1996 | Meinders |
| 5,654,863 | A | 8/1997 | Davies |
| 5,764,007 | A | 6/1998 | Jones |
| 5,841,312 | A | 11/1998 | Mindl et al. |
| 5,929,665 | A | 7/1999 | Ichikawa et al. |
| 6,028,470 | A | 2/2000 | Michel et al. |
| 6,163,138 | A | 12/2000 | Kohl et al. |
| 6,351,173 | B1 | 2/2002 | Ovens et al. |
| 6,426,857 | B1 | 7/2002 | Doster et al. |
| 6,597,556 | B1 | 7/2003 | Michel et al. |
| 6,812,553 | B2 | 11/2004 | Gerbsch et al. |
| 6,943,293 | B1 | 9/2005 | Jeter et al. |
| 7,095,098 | B2 | 8/2006 | Gerbsch et al. |
| 7,229,855 | B2 | 6/2007 | Murphy |
| 7,295,433 | B2 | 11/2007 | Taylor et al. |
| 7,459,954 | B2 | 12/2008 | Kuehner et al. |
| 7,538,425 | B2 | 5/2009 | Myers et al. |
| 7,551,439 | B2 | 6/2009 | Peugh et al. |
| 7,616,047 | B2 | 11/2009 | Rees et al. |
| 7,724,046 | B2 | 5/2010 | Wendt et al. |
| 7,750,720 | B2 | 7/2010 | Dittrich |
| 9,088,159 | B2 | 7/2015 | Peuser |
| 9,275,915 | B2 | 3/2016 | Heinisch et al. |

(56) References Cited

U.S. PATENT DOCUMENTS

| | | |
|---|---|---|
| 9,373,970 B2 | 6/2016 | Feuerstack et al. |
| 9,431,932 B2 | 8/2016 | Schmidt et al. |
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,843,320 B2 | 12/2017 | Richter et al. |
| 9,866,126 B2 | 1/2018 | Sato |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |
| 10,232,718 B2 | 3/2019 | Trunk et al. |
| 10,270,354 B1 | 4/2019 | Lu et al. |
| 10,291,225 B2 | 5/2019 | Li et al. |
| 10,525,847 B2 | 1/2020 | Strobel et al. |
| 10,797,579 B2 | 10/2020 | Hashim et al. |
| 10,924,001 B2 | 2/2021 | Li et al. |
| 11,082,052 B2 | 8/2021 | Jang et al. |
| 11,108,389 B2 | 8/2021 | Li et al. |
| 11,342,911 B2 | 5/2022 | Lee et al. |
| 11,838,011 B2 | 12/2023 | Li et al. |
| 11,843,320 B2 | 12/2023 | Sivakumar et al. |
| 11,848,426 B2 | 12/2023 | Zhang et al. |
| 11,851,038 B2 | 12/2023 | Solanki et al. |
| 11,855,522 B2 | 12/2023 | Rudolph et al. |
| 11,855,630 B2 | 12/2023 | Dake et al. |
| 11,870,338 B1 | 1/2024 | Narayanasamy |
| 11,872,997 B2 | 1/2024 | Hoos et al. |
| 11,881,859 B2 | 1/2024 | Gupta et al. |
| 11,888,391 B2 | 1/2024 | Balasubramanian et al. |
| 11,888,393 B2 | 1/2024 | Venkateswaran et al. |
| 11,901,803 B2 | 2/2024 | Ruck et al. |
| 11,901,881 B1 | 2/2024 | Narayanasamy |
| 11,909,319 B2 | 2/2024 | Esteghlal et al. |
| 11,916,426 B2 | 2/2024 | Oner et al. |
| 11,923,762 B2 | 3/2024 | Sethumadhavan et al. |
| 11,923,764 B1 | 3/2024 | Zhang |
| 11,923,799 B2 | 3/2024 | Ojha et al. |
| 11,925,119 B2 | 3/2024 | Male et al. |
| 11,927,624 B2 | 3/2024 | Patel et al. |
| 11,938,838 B2 | 3/2024 | Simonis et al. |
| 11,942,927 B2 | 3/2024 | Purcarea et al. |
| 11,942,934 B2 | 3/2024 | Ritter |
| 11,945,331 B2 | 4/2024 | Blemberg et al. |
| 11,945,522 B2 | 4/2024 | Matsumura et al. |
| 11,949,320 B2 | 4/2024 | Jaladanki et al. |
| 11,949,333 B2 | 4/2024 | Pahkala et al. |
| 11,955,896 B2 | 4/2024 | Liu et al. |
| 11,955,953 B2 | 4/2024 | Sinn et al. |
| 11,955,964 B2 | 4/2024 | Agarwal et al. |
| 11,962,234 B2 | 4/2024 | Narayanasamy et al. |
| 11,962,291 B2 | 4/2024 | Oberdieck et al. |
| 11,964,587 B2 | 4/2024 | Yukawa |
| 11,970,076 B2 | 4/2024 | Sarfert et al. |
| 11,977,404 B2 | 5/2024 | Chandrasekaran |
| 11,984,802 B2 | 5/2024 | Merkin et al. |
| 11,984,876 B2 | 5/2024 | Neidorff et al. |
| 11,990,776 B2 | 5/2024 | Dulle |
| 11,990,777 B2 | 5/2024 | Woll et al. |
| 11,996,686 B2 | 5/2024 | Chan et al. |
| 11,996,699 B2 | 5/2024 | Vasconcelos Araujo et al. |
| 11,996,714 B2 | 5/2024 | El Markhi et al. |
| 11,996,715 B2 | 5/2024 | Nandi et al. |
| 11,996,762 B2 | 5/2024 | Hembach et al. |
| 11,996,830 B2 | 5/2024 | Murthy et al. |
| 11,996,847 B1 | 5/2024 | Kazama et al. |
| 12,003,191 B2 | 6/2024 | Chaudhary et al. |
| 12,003,229 B2 | 6/2024 | Kaya et al. |
| 12,003,237 B2 | 6/2024 | Waters |
| 12,008,847 B2 | 6/2024 | Braun et al. |
| 12,009,679 B2 | 6/2024 | Gottwald et al. |
| 12,012,057 B2 | 6/2024 | Schneider et al. |
| 12,015,342 B2 | 6/2024 | Kienzler et al. |
| 12,019,112 B2 | 6/2024 | Jarmolowitz et al. |
| 12,021,517 B2 | 6/2024 | S et al. |
| 2006/0001459 A1 | 1/2006 | Audy |
| 2009/0322380 A1 | 12/2009 | Yanagishima et al. |
| 2012/0319754 A1 | 12/2012 | Lee et al. |
| 2017/0331469 A1 | 11/2017 | Kilb et al. |
| 2019/0074827 A1 | 3/2019 | Norling et al. |
| 2020/0195121 A1 | 6/2020 | Keskar et al. |
| 2021/0005711 A1 | 1/2021 | Martinez-Limia et al. |
| 2022/0052610 A1 | 2/2022 | Plum |
| 2022/0294441 A1 | 9/2022 | Purcarea et al. |
| 2023/0010616 A1 | 1/2023 | Gschwantner et al. |
| 2023/0061922 A1 | 3/2023 | Ritter |
| 2023/0082076 A1 | 3/2023 | Strache et al. |
| 2023/0126070 A1 | 4/2023 | Oberdieck et al. |
| 2023/0179198 A1 | 6/2023 | Winkler |
| 2023/0231210 A1 | 7/2023 | Joos et al. |
| 2023/0231400 A1 | 7/2023 | Oberdieck et al. |
| 2023/0231496 A1 | 7/2023 | Syed et al. |
| 2023/0238808 A1 | 7/2023 | Swoboda et al. |
| 2023/0268826 A1 | 8/2023 | Yan et al. |
| 2023/0335509 A1 | 10/2023 | Poddar |
| 2023/0365086 A1 | 11/2023 | Schumacher et al. |
| 2023/0370062 A1 | 11/2023 | Wolf |
| 2023/0378022 A1 | 11/2023 | Kim et al. |
| 2023/0386963 A1 | 11/2023 | Kim et al. |
| 2023/0402930 A1 | 12/2023 | Corry et al. |
| 2023/0420968 A1 | 12/2023 | Oner et al. |
| 2023/0421049 A1 | 12/2023 | Neidorff |
| 2024/0006869 A1 | 1/2024 | Kim et al. |
| 2024/0006899 A1 | 1/2024 | Wernerus |
| 2024/0006993 A1 | 1/2024 | Barjati et al. |
| 2024/0022187 A1 | 1/2024 | Fassnacht |
| 2024/0022240 A1 | 1/2024 | Balaz |
| 2024/0022244 A1 | 1/2024 | S et al. |
| 2024/0030730 A1 | 1/2024 | Wernerus |
| 2024/0039062 A1 | 2/2024 | Wernerus |
| 2024/0039402 A1 | 2/2024 | Bafna et al. |
| 2024/0039406 A1 | 2/2024 | Chen et al. |
| 2024/0048048 A1 | 2/2024 | Zhang |
| 2024/0055488 A1 | 2/2024 | Lee et al. |
| 2024/0067116 A1 | 2/2024 | Qiu |
| 2024/0072675 A1 | 2/2024 | Formenti et al. |
| 2024/0072817 A1 | 2/2024 | K et al. |
| 2024/0077899 A1 | 3/2024 | Chitnis et al. |
| 2024/0078204 A1 | 3/2024 | Roehrle et al. |
| 2024/0079950 A1 | 3/2024 | Narayanasamy |
| 2024/0079958 A1 | 3/2024 | Kumar et al. |
| 2024/0080028 A1 | 3/2024 | Dake et al. |
| 2024/0088647 A1 | 3/2024 | Ramadass et al. |
| 2024/0088896 A1 | 3/2024 | Bilhan et al. |
| 2024/0097437 A1 | 3/2024 | Goyal et al. |
| 2024/0097459 A1 | 3/2024 | Swoboda et al. |
| 2024/0105276 A1 | 3/2024 | Duryea |
| 2024/0106248 A1 | 3/2024 | Woll et al. |
| 2024/0106435 A1 | 3/2024 | Zhang et al. |
| 2024/0113517 A1 | 4/2024 | Sriraj et al. |
| 2024/0113611 A1 | 4/2024 | Kaufmann et al. |
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |

(56) References Cited

U.S. PATENT DOCUMENTS

| | | |
|---|---|---|
| 2024/0213975 A1 | 6/2024 | Narayanasamy |
| 2024/0213981 A1 | 6/2024 | Agarwal et al. |
| 2024/0270186 A1* | 8/2024 | Pfeilschifter ........... B60R 16/03 |

FOREIGN PATENT DOCUMENTS

| | | |
|---|---|---|
| WO | 2019034505 A1 | 2/2019 |
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC- E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/IEEE/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

* cited by examiner

SYSTEMS AND METHODS FOR NON-OVERLAP ENFORCEMENT FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for a gate driver for an inverter for an electric vehicle, and, more particularly, to systems and methods for a gate driver with a closed loop non-overlap enforcement architecture for a phase switch for an inverter for an electric vehicle.

BACKGROUND

Inverters, such as those used to drive a motor in an electric vehicle, for example, are responsible for converting High Voltage Direct Current (HVDC) into Alternating Current (AC) to drive the motor. In an inverter, overlapping turn-on events of opposing phase switches can damage the inverter, and dead time between switching events to avoid overlapping turn-on events contributes to inefficiencies in the inverter.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a first galvanic interface configured to separate a first high voltage area from a low voltage area; a first low voltage controller in the low voltage area, the first low voltage controller configured to receive a first PWM signal from a PWM controller, and send a first control signal using the first galvanic interface to a first high voltage controller in the first high voltage area based on the first PWM signal; a second galvanic interface configured to separate a second high voltage area from the low voltage area; and a second low voltage controller in the low voltage area, the first low voltage controller configured to receive a second PWM signal from the PWM controller, and send a second control signal using the second galvanic interface to a second high voltage controller in the second high voltage area based on the second PWM signal, wherein the second low voltage controller is configured to provide an output latch signal to the first low voltage controller and receive an input latch signal from the first low voltage controller, and wherein the output latch signal is based on the second PWM signal and the input latch signal.

In some aspects, the techniques described herein relate to a system, wherein the first low voltage controller is further configured to receive a feedback signal over the first galvanic interface from the first high voltage controller, and wherein the input latch signal is based on the first PWM signal, the output latch signal, and the feedback signal.

In some aspects, the techniques described herein relate to a system, wherein the first low voltage controller is configured to send the first control signal using a set of communication lines of the first galvanic interface and receive the feedback signal using the set of communication lines in the first galvanic interface.

In some aspects, the techniques described herein relate to a system, wherein the first control signal is configured to control a phase switch of an inverter, and the feedback signal is configured to indicate an off-state of the phase switch.

In some aspects, the techniques described herein relate to a system, wherein the first low voltage controller is configured to record a time based on the first PWM signal and the feedback signal.

In some aspects, the techniques described herein relate to a system, wherein the first low voltage controller is configured to generate a fault based on the first PWM signal and the output latch signal.

In some aspects, the techniques described herein relate to a system, wherein the output latch signal and the input latch signal enable the first PWM signal in the first low voltage controller and the second PWM signal in the second low voltage controller, respectively.

In some aspects, the techniques described herein relate to a system, further including: the battery configured to supply the DC power to the inverter; and the motor configured to receive the AC power from the inverter to drive the motor.

In some aspects, the techniques described herein relate to a system including: a high voltage controller configured to be in a high voltage area separated from a low voltage area by a galvanic interface including a command channel and a message channel, the high voltage controller configured to receive a control signal from a low voltage controller in the low voltage area using the command channel of the galvanic interface, control a phase switch based on the control signal, and send a switch state signal to the low voltage controller using the command channel of the galvanic interface, wherein the high voltage controller is configured to control the switch state signal based on a state of the phase switch.

In some aspects, the techniques described herein relate to a system, wherein the high voltage controller is configured to send the switch state signal using the command channel of the galvanic interface when the high voltage controller is not receiving the control signal from the command channel of the galvanic interface.

In some aspects, the techniques described herein relate to a system, wherein the high voltage controller is configured to send the switch state signal by sending a burst of galvanic pulses on the command channel of the galvanic interface.

In some aspects, the techniques described herein relate to a system, wherein the high voltage controller includes one or more point-of-use controllers on a power module with the phase switch.

In some aspects, the techniques described herein relate to a system, wherein the high voltage controller is configured to send the control signal to one or more point-of-use controllers on a power module with the phase switch, and receive the switch state signal from the one or more point-of-use controllers.

In some aspects, the techniques described herein relate to a system, wherein the high voltage controller is further configured to invert the switch state signal, and send the switch state signal and the inverted switch state signal to the low voltage controller using the command channel of the galvanic interface.

In some aspects, the techniques described herein relate to a system including: a galvanic interface configured to separate a high voltage area from a low voltage area; a low voltage controller in the low voltage area, the low voltage controller including: a PWM comparator configured to receive a PWM signal and an input latch signal, and generate a PWM comparator signal based on a comparison of the PWM signal and the input latch signal, a low voltage pulse generator configured to generate an upstream pulse based on the PWM comparator signal, a low voltage transmitter configured to send the upstream pulse to the galvanic interface, a low voltage receiver configured to receive a downstream pulse from the galvanic interface, a low voltage demodulator configured to generate a low voltage demodulated signal based on the downstream pulse, and an enable latch configured to be set with the low voltage demodulated signal and to be reset with the PWM comparator signal, the enable latch further configured to provide an output latch signal; and a high voltage controller in the high voltage area, the high voltage controller including: a high voltage receiver configured to receive the upstream pulse from the galvanic interface, a high voltage demodulator configured to generate a high voltage demodulated signal based on the upstream pulse, the high voltage demodulated signal configured to control a phase switch, a high voltage off-state detector configured to detect an off-state of the phase switch, a high voltage pulse generator configured to generate the downstream pulse based on the detected off-state of the phase switch, and a high voltage transmitter configured to send the downstream pulse to the galvanic interface.

In some aspects, the techniques described herein relate to a system, wherein the high voltage controller includes one or more point-of-use controllers on a power module with the phase switch.

In some aspects, the techniques described herein relate to a system, wherein the low voltage controller further includes: a roundtrip timer configured to record a time from when the PWM signal changes to a logic low to when the output latch signal changes to a logic high.

In some aspects, the techniques described herein relate to a system, wherein the low voltage controller further includes: an overlap comparator configured to generate a fault when the PWM signal is a logic high and the input latch signal is a logic low.

In some aspects, the techniques described herein relate to a system, wherein the high voltage controller further includes: a high voltage inverter configured to invert the downstream pulse to the high voltage transmitter.

In some aspects, the techniques described herein relate to a system, wherein the low voltage controller further includes: a low voltage inverter configured to invert the upstream pulse to the low voltage transmitter.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
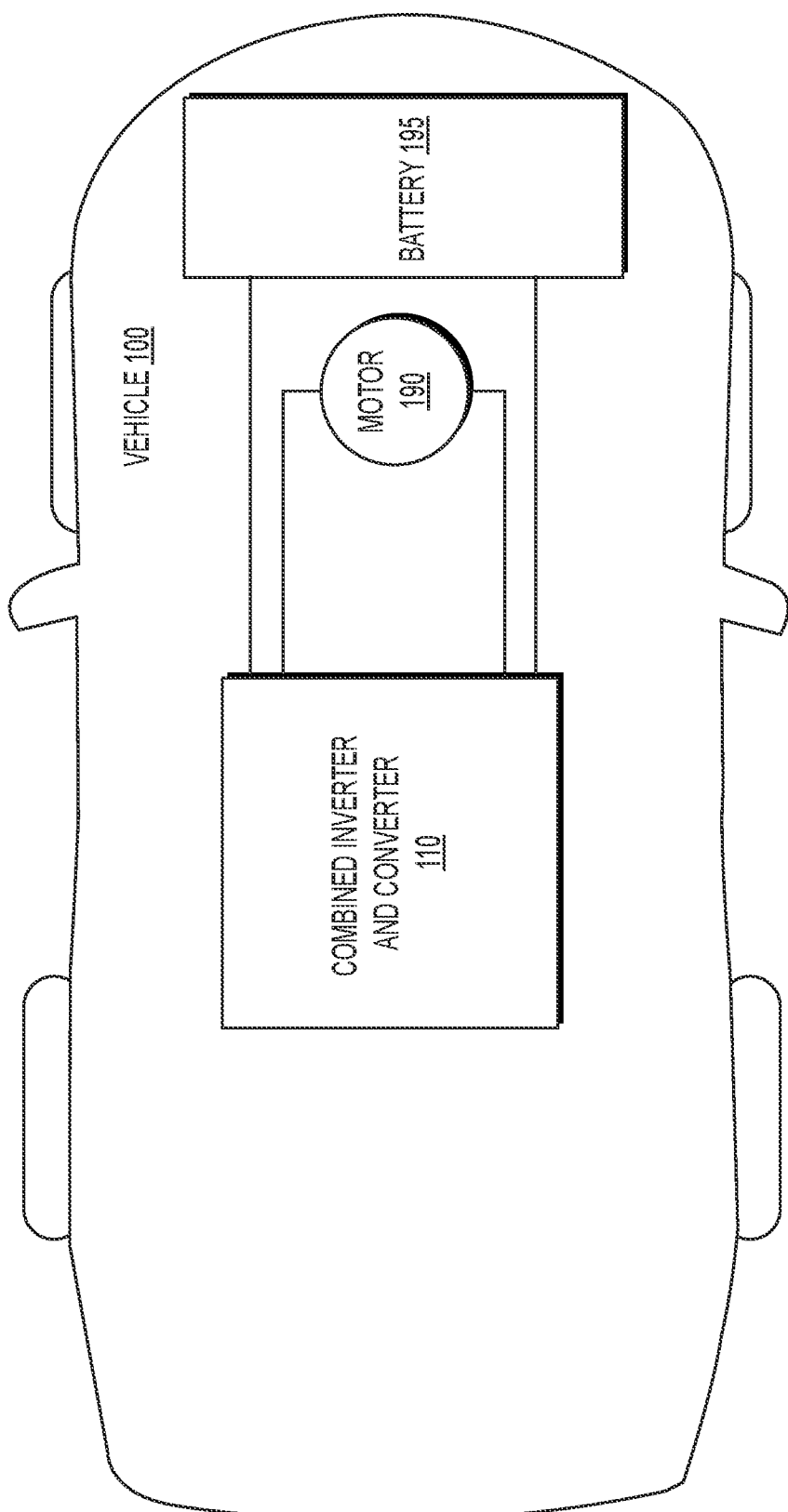
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for a gate driver for an inverter for an electric vehicle, and, more particularly, to systems and methods for a gate driver with a closed loop non-overlap enforcement architecture for a phase switch for an inverter for an electric vehicle.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three half-H bridge switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the half-H bridge switches. The half-H bridge switches may drive the phase voltage. The inverter may include an isolation barrier between low voltage and high voltage planes. Signals may pass from the PWM controller to the half-H bridge switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the half-H switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

As discussed above, the half-H switch may be an insulated gate bipolar transistor (IGBT), metal oxide semiconductor field effect device (MOSFET), or another semiconductor device, for example. The switch-on and switch-off times of the half-H switch may vary from device to device, vary with operating temperature, and with changes in the gate driver power supply, for example. A key design aspect for controlling an operation of a half-H switch is to guarantee that opposing sides (e.g. upper phase and lower phase) of the switch are not on at the same time. This is accomplished by deliberately including a non-overlap time, or dead time, from the command off of an on-state switch to the command on of the opposing off-state switch. Overlapping on-states of opposing switches results in a shoot-through condition, which leads to an overcurrent event that can damage the system. Some design techniques use a fixed non-overlap time that is enforced using logic prior to sending the PWM signals to the gate drivers that control the switches.

Circuitry may be used on both sides of the half-H switch to detect and react to overcurrent events, because overlap events may occur in spite of fixed time-based non-overlap logic. Shoot-through events may occur because the act of commanding a switch off does not guarantee that the switch will reach the off-state command prior to the command on of the opposing switch, such as due to failure of the gate driver, failure of the switch, or failure of the non-overlap logic, for example. For these reasons, fixed time-based non-overlap enforcement is inherently open-loop, in that confirmation of the off-state of one switch is not used to enable the command on of the opposing switch.

A closed-loop non-overlap control system is one whereby the command-on signal to a switch is blocked unless a feedback signal verifies that an opposing switch in is the off-state. Another way to describe this form of closed-loop system would be to define it as "break-before-make", in that you must break (command off) one switch before you make (command on) an opposing switch. A system which only uses a fixed non-overlap time cannot be defined as a break-before-make system.

Conversion efficiency in an inverter system may be improved when the dead time is reduced. Deadtime is a phase of operation within an inverter control system where both the upper and lower switches are open, and the phase voltage is not driven by the switches to a defined voltage. The resulting deadtime phase voltage is a function of the direction and magnitude of the phase load current and the open-switch electrical characteristics. The deadtime phase of operation is a time where the phase voltage is not driven to the desired state of the system controller, and thus represents a period of reduced switching efficiency. The minimum allowed dead time may be determined by considering all sources of variation that can increase the time needed to turn an on-state switch off and all sources of variation that can reduce the time needed to turn the opposing off-state switch on. A statistical analysis may be required to calculate the probability that a non-overlap event could occur.

The time between a PWM command off at the input of a gate driver to the time where the switch is fully off may have a range of values due to variation of characteristics of components in the signal path, including the switch itself. The time between a PWM command on at the input of a gate driver to the time where the switch begins to turn on may have a range of values due to variation of characteristics of components in the signal path, including the switch itself. These two-time functions are separated by the non-overlap time as part of system architecture. An overlap of these two-time functions will result in a shoot-through condition. Some aspects of variation within these two-time functions may be statistical in nature, having averages and standard deviations, such that there may never be a zero probability of overlap. The best that may be achieved for the two-time functions is to reduce the overlap probability by using a sufficiently long non-overlap time.

The above analysis applies to the case where the system operates as expected, without failures that would cause the system to not follow the expected command on and command off time functions. For example, a PWM pin that is permanently or transiently stuck to the asserted (high) state may be a failure mechanism that would cause the system to not follow the expected command-off time function, and which will lead to a shoot-through event.

Some designs describe a two-channel closed-loop non-overlap methodology that may address the shortcomings of time-based open-loop non-overlap enforcement. Closed-loop non-overlap enforcement may use the principle that a signal must be received from a switch to indicate that the switch is in the off-state prior to allowing an opposing switch to be commanded on. Some designs describe a two-channel system where a feedback channel is used to communicate the real-time on- or off-state of the switch, and a separate command channel is used to communicate the desired on or off command state of the switch.

Two channels are generally required for simultaneous communication of command and feedback data due to the nature of the communication channel. In applications such as an inverter, communication between the low-voltage controller domain and the high-voltage switch domain is performed across a galvanic isolation barrier which cannot arbitrarily support simultaneous command data flowing in one direction and feedback data flowing in the opposing direction.

Communication across a galvanic isolation barrier requires that a high amplitude signal be produced from the transmitting side and that a highly sensitive receiver be used on the receiving side, due to the inherently lossy nature of the galvanic isolation barrier. The signal loss factor across a capacitive galvanic barrier is a function of the series capacitance between the sending and receiving sides and the parasitic capacitance of the receiving side of the galvanic barrier. A loss factor of between 10:1 and 100:1 would be an appropriate range to expect from a real hardware implementation. This high loss factor typically implies that it is impractical to simultaneously communicate signals in both directions across a galvanic barrier.

While a galvanic channel can be designed to allow bidirectional communication by placing transmitters and receivers on both side of the barrier, communication is typically restricted to one direction at a time. Complicating this situation are typical requirements that the command-on signal state be defined as the presence of continuous communication from the sender to the receiver, such that the loss of continuous communication from the sender is interpreted as a command off signal to the switch by the receiver. Such a requirement is foundationally important for functional safety, in that the loss of a transmitter, due to any fault condition, must not result in a persistent command on state of a switch.

One observation which eases the requirement for a two-channel solution is the realization that a command-on signal is generally defined as the presence of continuous signaling from the sender to the receiver, whereas a command-off signal is defined as the continuous absence of a signal. In the general application of command and feedback signaling, it is necessary to allow for either the presence or absence of continuous signaling along both command and feedback channels, and thus necessary to require two independent channels to avoid a collision of data which could occur if command and feedback were traveling in opposing directions along a single galvanic channel.

In the specific case of ensuring that a single switch first receives a command-off signal along a single galvanic channel in the form of a lack of continuous signaling from the controller domain to the switch domain, and that, second, the switch verifies that the switch is in a command off state by sending a signal down the same single (presently idle) galvanic channel from the switch domain to the controller domain, a two-channel solution may be reduced to a specific one-channel solution.

Galvanic isolation requires a significant area to implement, and each galvanic isolation channel represents the opportunity for a defect-related failure to occur. One or more embodiments may provide a closed-loop feedback system using one galvanic isolation channel to eliminate the added cost and defect-related failure mechanisms associated with two galvanic isolation channels.

Some designs using galvanic isolated circuits and PWM non-overlap control methodologies may describe PWM control over a half-H architecture using galvanically isolated circuits, whereby non-overlap of PWM signals routed to high and low half-H switches are controlled using centralized logic which uses the fed-back state of the half-H switches to prevent simultaneous command-on signals being sent to both high and low half-h switches. Some designs show two signals traveling through two galvanic interfaces, where a first signal is the PWM signal and a separate second signal is the PWM enable that is asserted once the opposing switch is confirmed to be in the off-state. This design requires a dedicated second galvanic channel, which leads to added cost and the possibility of defect-induced failures. Some designs accept that a two-channel approach is a necessity. Some designs have not considered the re-use of the command channel to communicate a burst of data as feedback. Here, re-use refers to transmitting and receiving signals on the same signal line or signal lines of the command channel, as opposed to sending a signal on a first signal line, or pathway, and receiving a signal on a separate second pathway.

One or more embodiments may address the problems of open-loop non-overlap enforcement and the problems of two-channel closed-loop non-overlap enforcement. An off-state detector in a point-of-use controller may assert an output signal when a switch is detected to be in an off-state following a command off signal. A pulse burst transmitter in the point-of-use controller may send a short burst of galvanic pulses in a downstream direction in a normally upstream galvanic command channel when the off-state detector asserts the output signal. A galvanic transmitter in the high-voltage domain of a gate driver may re-transmit the downstream galvanic pulses from the point-of-use controller. A galvanic receiver in the low-voltage domain of the gate driver may detect the re-transmitted downstream galvanic pulses. A demodulator in the low-voltage domain of the gate driver may convert the detected pulses to a logic 1 state. A detect latch in the low-voltage domain of the gate driver may be set when the demodulator asserts the logic 1 state. An AND gate in the low-voltage domain of the gate driver may perform a logic AND operation with a PWM input signal and set the output of an enable latch for the opposing phase switch to enable (set an enable latch to a logic 1 state) and disable (set the enable latch to a logic 0 state) the PWM on-state (logic 1) from being observed by the phase switch. An overlap detector may detect the case when the PWM input to the AND gate is a logic 1 and the latch input to the AND gate is 0, thus indicating that the system is attempting to turn on the phase switch without having received confirmation of an off-state from the opposing phase switch. A roundtrip timer may count the time between the enable latch from the output of the AND gate being set to logic 0 and the time when the enable latch is set to logic 1, thus indicating the roundtrip command off time.

Some designs may describe a half-H switch environment with upper and lower switch channels, each including an upstream command channel for communicating on/off control signals from the low-voltage domain to the high-voltage domain, and a downstream message channel for communicating the real-time on/off status of the switch from high-voltage domain to the low-voltage domain. Some designs may describe a PWM controller that has the ability to send PWM high and low states upstream in the command channel and process data coming downstream in the message channel in order to condition the PWM commands to prevent shoot-through events. Some designs may require a dedicated galvanic channel to communicate the continuous real-time status feedback of the switch.

One or more embodiments may communicate the off-state status of the switch using the galvanic command channel at a point in time when the channel is no longer communicating a command on-state, and may communicate the off-state status of the switch using a burst of galvanic pulses which persist only long enough to communicate that a successful off-state has been reached. One or more embodiments may include a roundtrip timer. One or more embodiments may include a non-overlap detector. One or more embodiments may include one fewer galvanic channel per switch than some designs. For example, for a three-phase inverter that uses six switch channels, one or more embodiments may save six total galvanic channels compared to some designs which have twelve galvanic channels. Each galvanic channel may require area within the integrated circuit or may require external components to implement, and thus one or more embodiments may be less expensive and have a lower probability of defect-related failures than some designs. One or more embodiments may include closed-loop non-overlap violation detection and roundtrip timer diagnostics, which are advantages over some designs.

Some designs may seem to be able to provide a real-time on or off-state status of the switch to the low voltage plane, and this would seem to provide an extra level of protection against, for example, the case of a switch suddenly and instantaneously turning on, when the opposing switch is presently on. This would seem to allow the PWM controller or diagnostic circuitry to protect against a shoot-through condition under this fault. However, there is a finite time required for a change of switch status from an off-state to on-state to be communicated to the low voltage plane so that the opposing switch can be commanded off. A shoot-through event that results from this fault will be present for the entire time that it takes to communicate the fault from the high voltage plan to the low voltage plane and then communicate a response from the low voltage plane to the high voltage plane. There is no advantage to having a dedicated secondary galvanic channel to communicate that an uncontrolled command on has occurred, because the communication of this information will not prevent a shoot-through event due to the delay in communicating the undesired command state and the delay in mitigating the fault by commanding the opposing channel off. The response of the system will be to have a shoot-through event which must be managed by the circuitry located in the high-voltage domain.

It is understood by those skilled in the art that a shoot-through event can only be successfully responded to by overcurrent detection and response circuitry placed at the switches themselves and that a communication feedback loop to another controller is far too slow. If this were not true, then some designs would not show point-of-use overcurrent detection, such as desaturation detection or shunt current detections. However, by showing point-of-use overcurrent detection, some designs provide a demonstration that some designs are not attempting to replace overcurrent detection with closed loop feedback response. Additionally, a failure of the galvanic interface may prevent closed-loop feedback from responding to overcurrent conditions.

Therefore, one or more embodiments may provide closed-loop feedback that is useful for preventing shoot-through events by requiring that confirmation of a switch off-state is required to enable the command on of the opposing switch. The real-time status of a switch being in an on or off-state is not required once verification of a switch off-state has been received, because the real-time information is too slow and unreliable to be used for reacting to a shoot-through event, and only point-of-use overcurrent detection and response are fast enough and reliable enough to use. Real-time switch on/off-state feedback is therefore not a required feature to prevent shoot-through events. Some designs may be over-designed for preventing shoot-through events by dedicating an entire galvanic channel to real-time feedback of switch status. One or more embodiments may be optimally designed to use a single burst of downstream galvanic data through the available command channel to indicate that a successful off-state of a switch has been reached to enable the command on of the opposing switch.

As discussed above, in an inverter, overlapping turn-on events of opposing phase switches can damage the inverter, and dead time between switching events to avoid overlapping turn-on events contributes to inefficiencies in the inverter. Time-based non-overlap may fail if a gate-to-source voltage is too slow, a gate-to-source voltage is stuck high, a galvanic bus communication fails, a PWM signal is stuck high, or non-overlap logic fails.

One or more embodiments may provide a closed loop non-overlap enforcement architecture that ensures that an on-state phase switch is off prior to allowing a complementary off-state phase switch to turn on.

When upper and lower phase switches are both off and either is free to turn on, a lower PWM rising-edge may send continuous galvanic pulses up the command channel, indicating command on to the lower phase switch. Next, a lower PWM rising-edge may clear a lower latch that asserts a logic 0 into an upper AND gate, blocking the upper phase switch from turning on. Next, a lower PWM falling-edge may stop the upstream galvanic pulses, indicating command off to the lower phase switch. Next, the lower phase switch may send a "lower switch is off" downstream pulse burst (such as for 300 nS, for example) when the command off signal results in the lower phase switch successfully turning off. Next, the "lower switch is off" signal may assert a logic 1 to the lower latch that feeds the upper AND gate. The lower PWM rising-edge may not be accepted until the lower "lower switch is off" confirmation has been received. Overlap violations (i.e. PWM=1 AND latch=0) may not propagate upstream and may be detected to set faults or report via a Serial Peripheral Interface, for example. A round-trip timer within each gate driver may be used for fault analysis. One or more embodiments may provide a closed loop non-overlap enforcement architecture in a gate driver rather than in a PWM controller to reduce the propagation delay of sending feedback to the PWM controller for signal processing. By ensuring that an on-state phase switch is off prior to allowing a complementary off-state phase switch to turn on, one or more embodiments may provide a closed loop feedback system that does not use a fixed non-overlap time or that allows for a fixed non-overlap but prevents non-overlap events that may occur due to fault conditions or when the fixed non-overlap time is statistically incapable. One or more embodiments may support a minimum non-overlap time of approximately 1 µS, which may be comparable to some open-loop designs. One or more embodiments may provide closed loop feedback with one galvanic channel.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
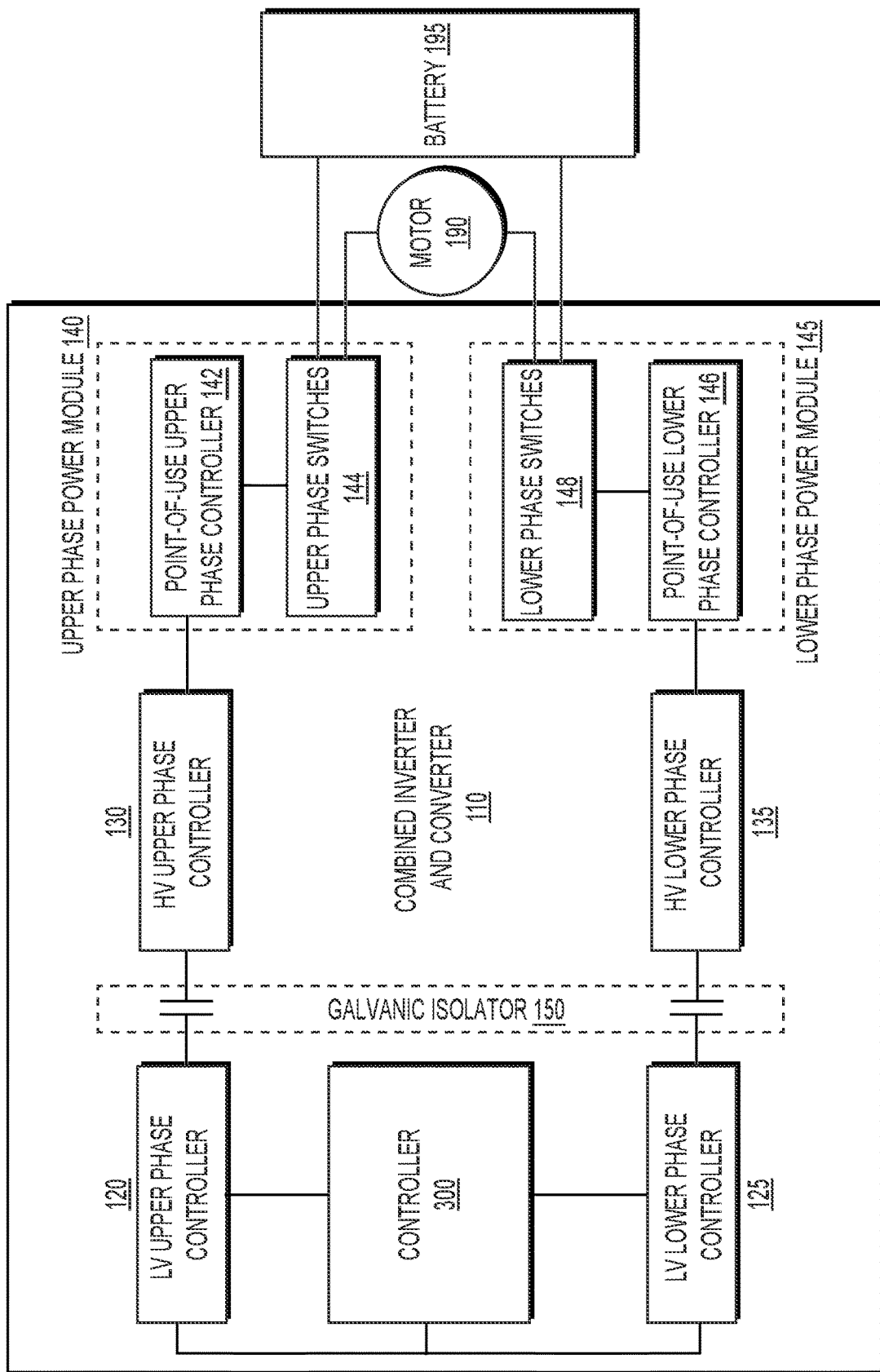
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries an inverse data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
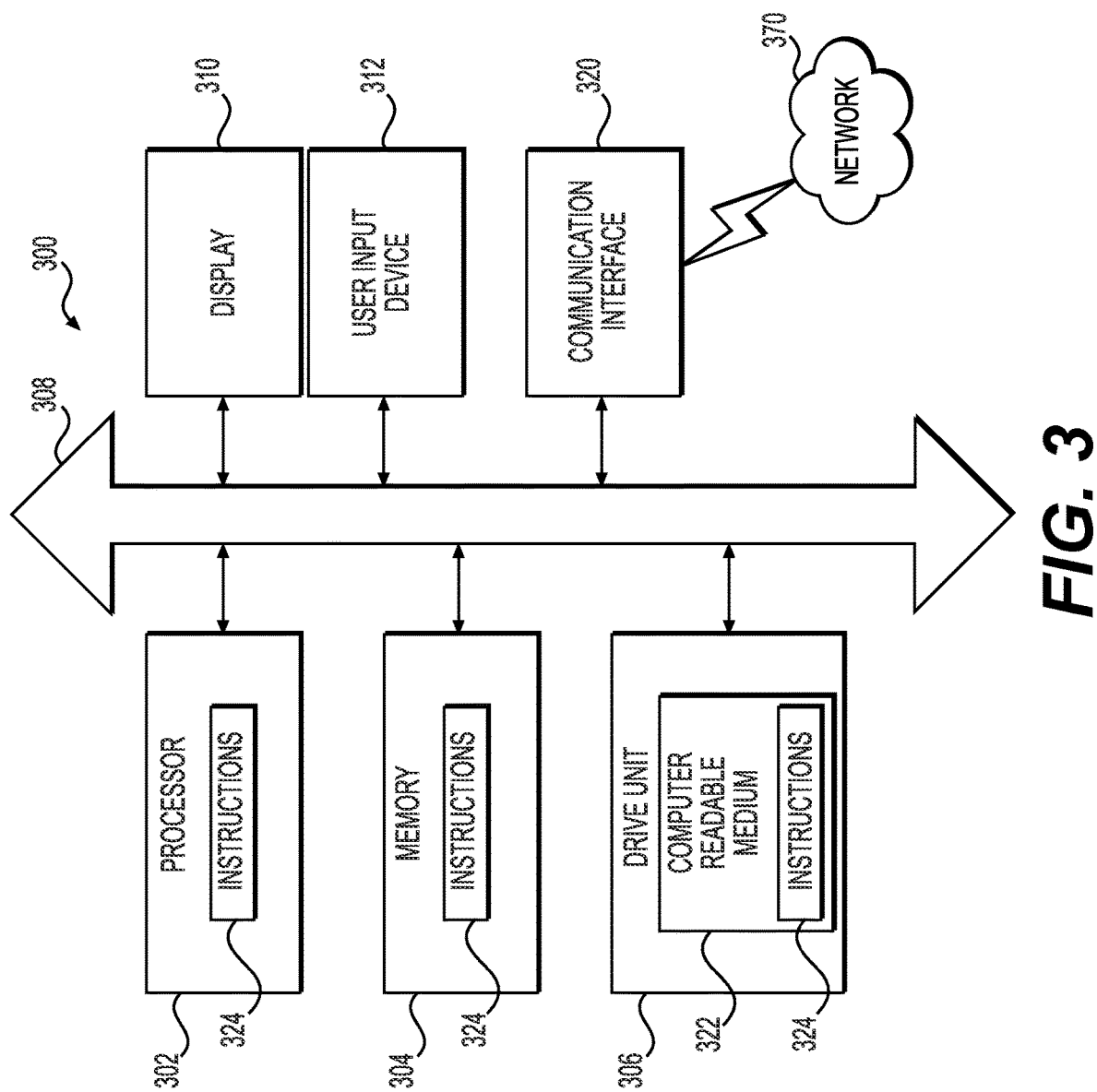
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer-based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
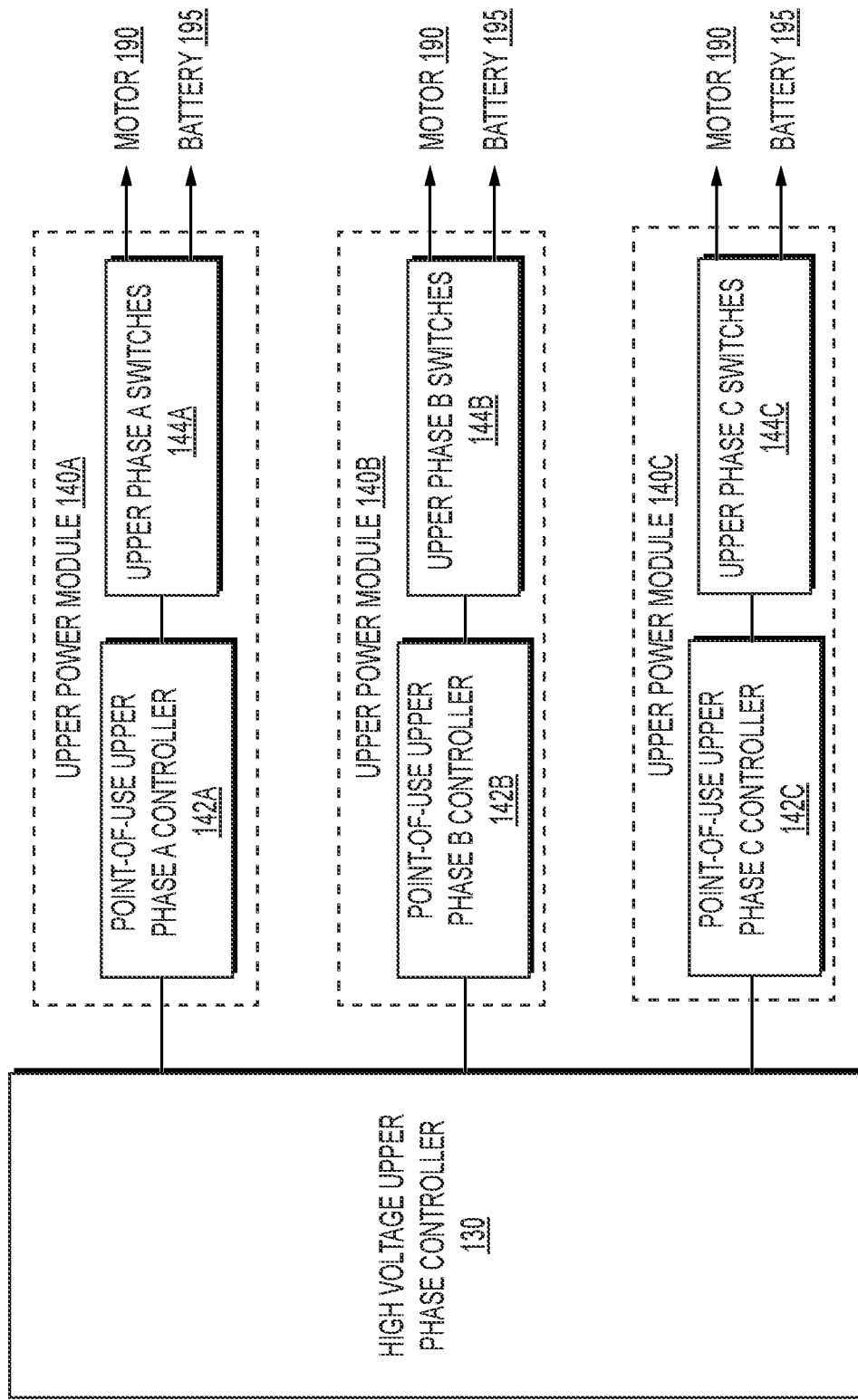
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
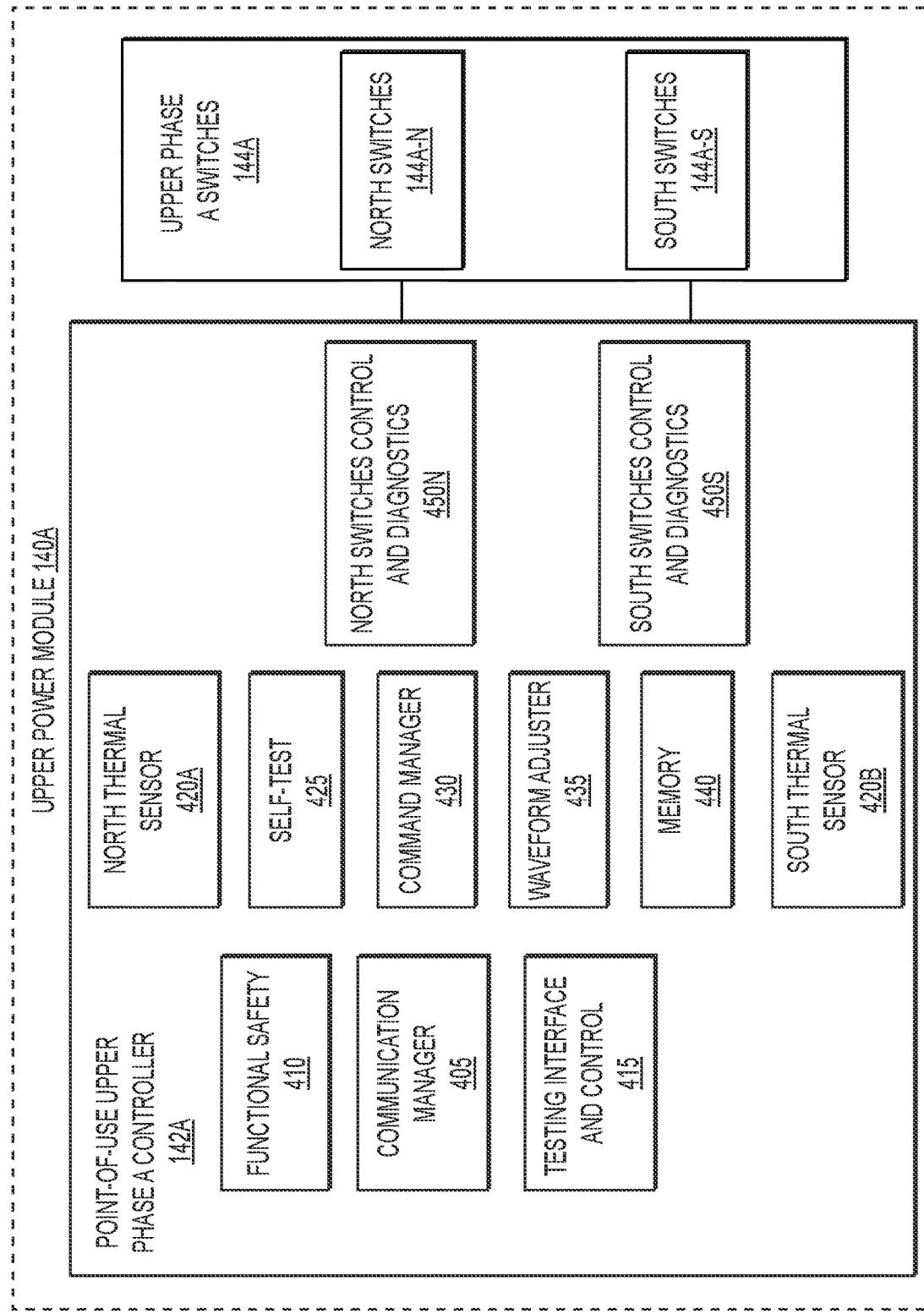
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
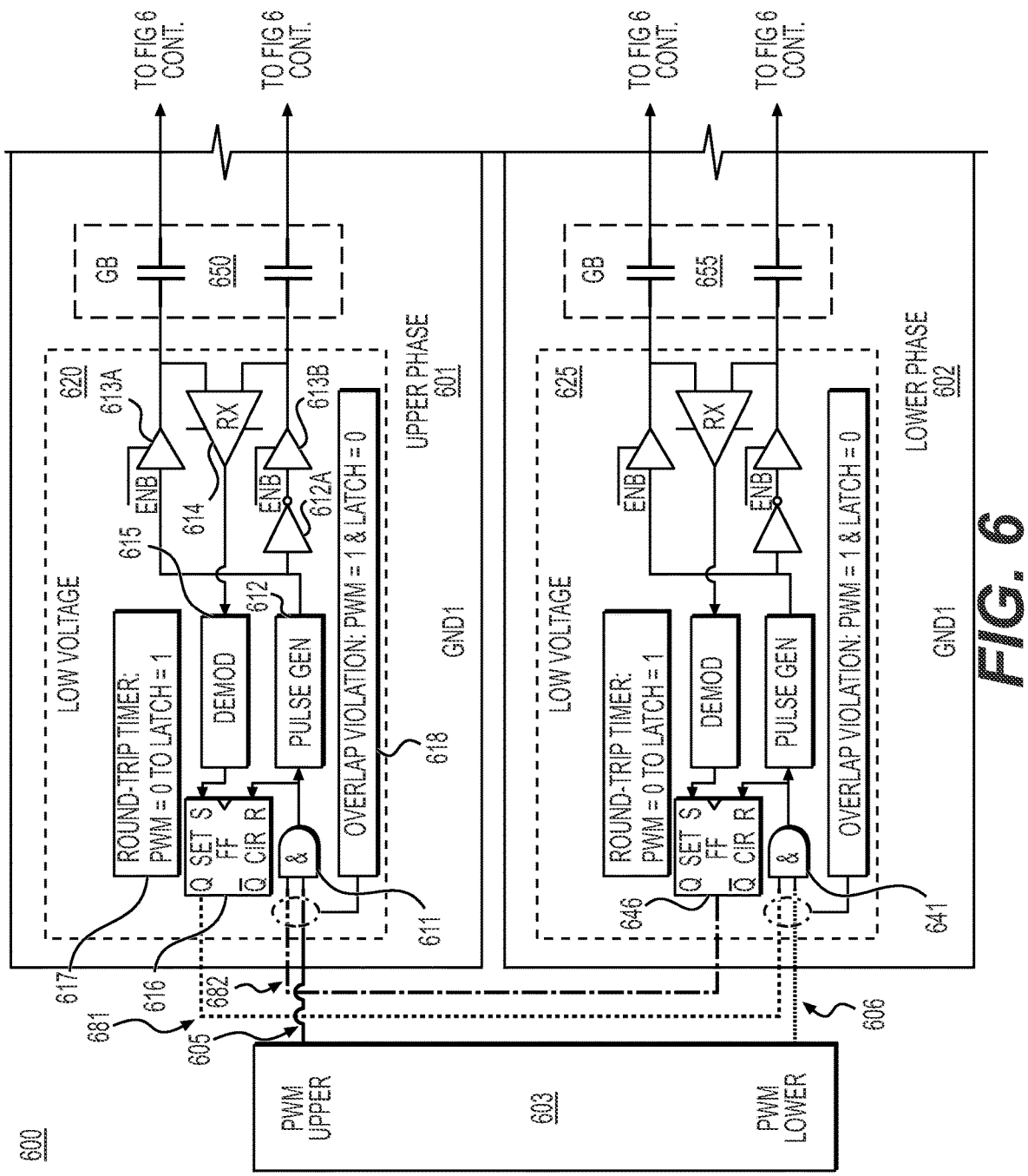
FIG. 6 depicts an exemplary system for a closed loop non-overlap enforcement gate driver for a phase switch, according to one or more embodiments.
Figure 6:
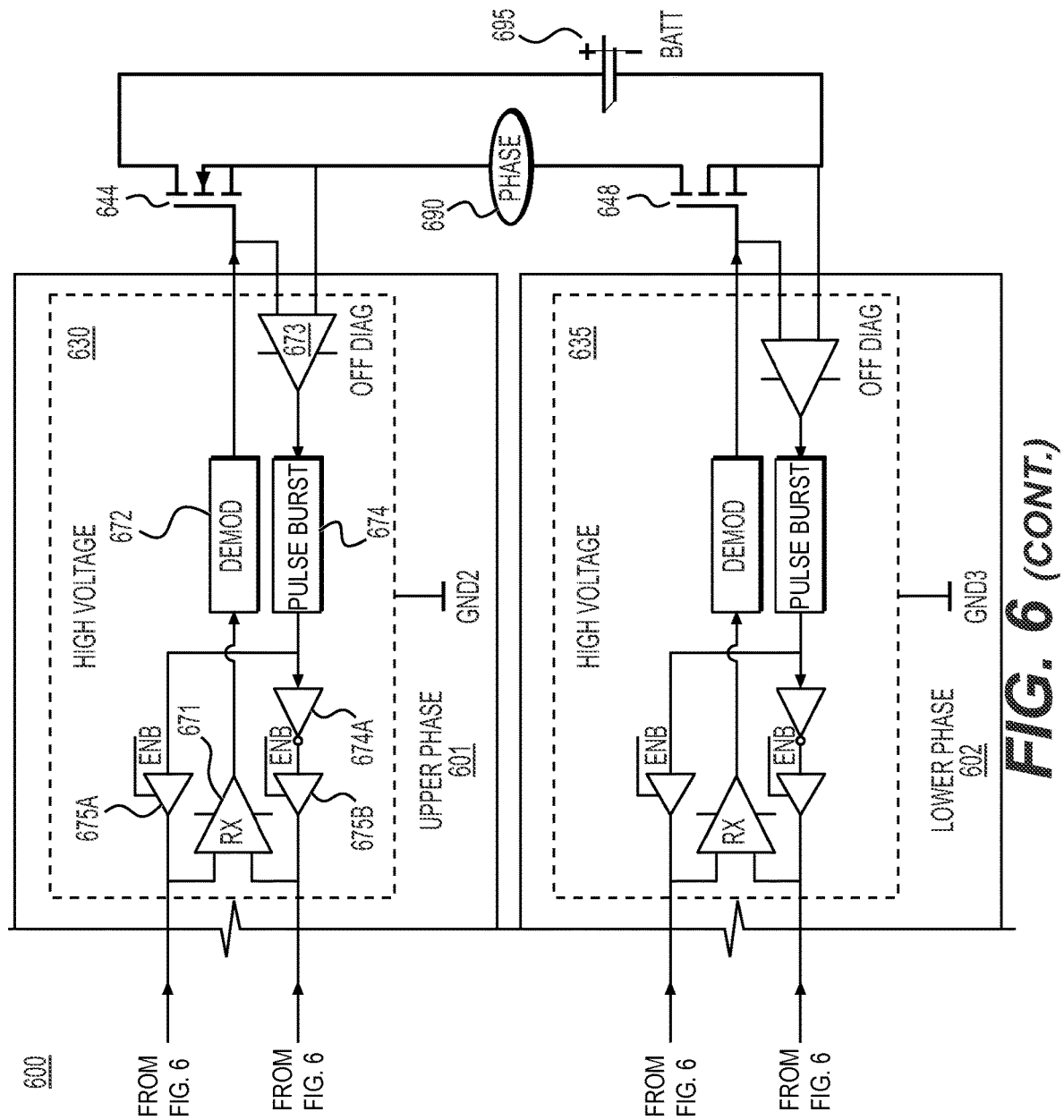
Figure 7:
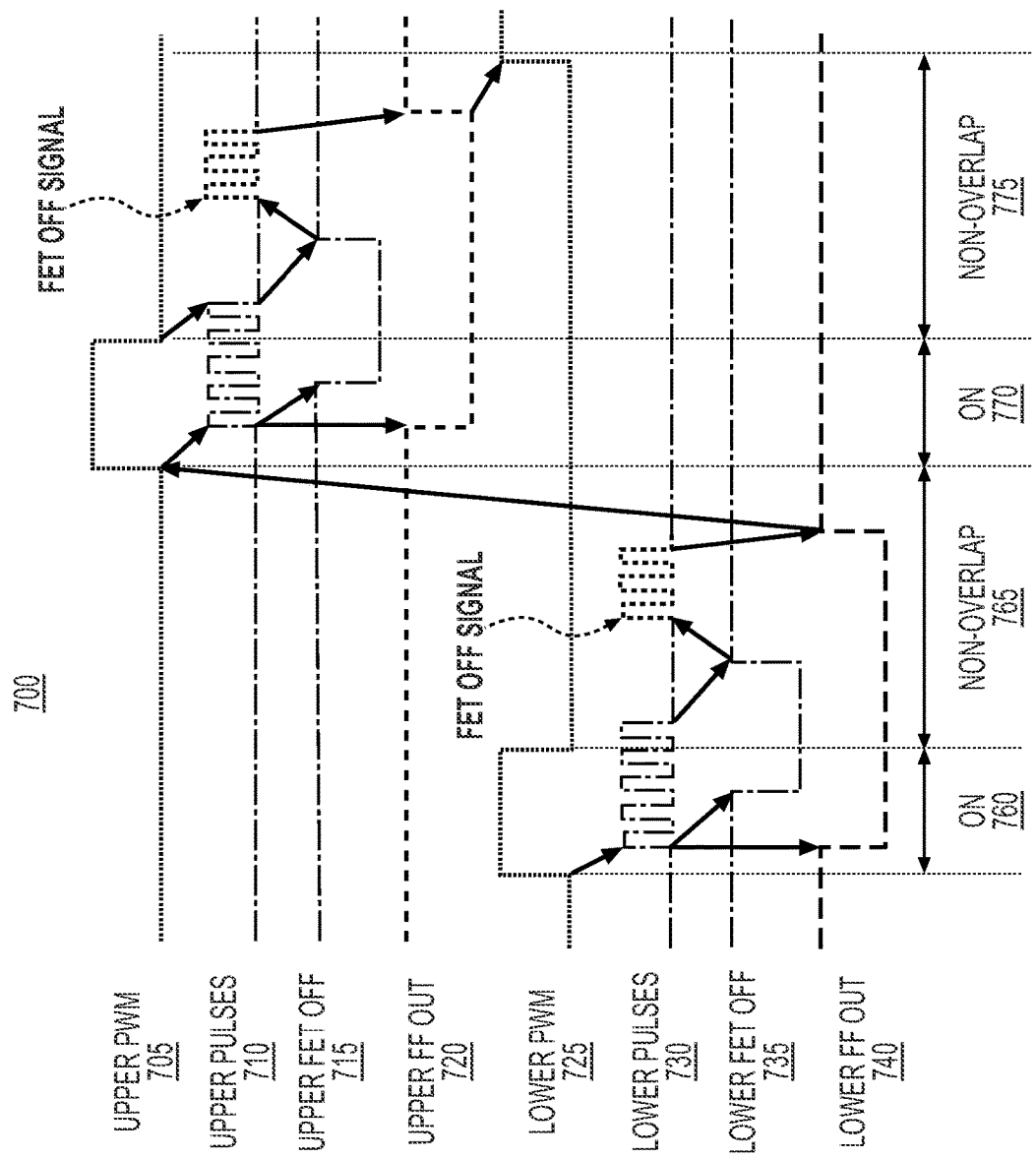
FIG. 7 depicts an exemplary waveform diagram for a closed loop non-overlap enforcement gate driver for a phase switch, according to one or more embodiments.

FIG. 6 depicts an exemplary system for a closed loop non-overlap enforcement gate driver for a phase switch, according to one or more embodiments. FIG. 7 depicts an exemplary waveform diagram for a closed loop non-overlap enforcement gate driver for a phase switch, according to one or more embodiments.

FIG. 6 includes a command channel for communicating on/off control signals from a low-voltage domain to a high-voltage domain. FIG. 6 shows a modified half-H switch environment where the message channel is not shown, and the command channel includes hardware that allows data to flow from the high-voltage domain to the low-voltage domain by re-using the command channel rather than using a dedicated real-time FET status feedback channel. One or more embodiments may be described by example using the following architecture and operations with reference to FIG. 6 and FIG. 7.

System 600 may include a PWM controller 603, upper phase gate driver 601 for upper phase switch 644, and lower phase gate driver 602 for lower phase switch 648. Upper phase switch 644 and lower phase switch 648 may be connected to a phase 690 of motor 190 and terminals 695 of battery 195. PWM controller 603 may be an implementation of inverter controller 300, for example. Upper phase switch 644 may be an implementation of upper phase switches 144, for example. Lower phase switch 648 may be an implementation of lower phase switches 148, for example. Upper phase gate driver 601 may include low voltage upper phase controller 620 and high voltage upper phase controller 630 separated by galvanic isolator 650. For example, low voltage upper phase controller 620 may be an implementation of low voltage upper phase controller 120, high voltage upper phase controller 630 may be an implementation of high voltage upper phase controller 130 and point-of-use upper phase controller 142, and galvanic isolator 650 may be an implementation of galvanic isolator 150. Lower phase gate driver 602 may include low voltage lower phase controller 625 and high voltage lower phase controller 635 separated by galvanic isolator 655. For example, low voltage lower phase controller 625 may be an implementation of low voltage lower phase controller 125, high voltage lower phase controller 635 may be an implementation of high voltage lower phase controller 135 and point-of-use lower phase controller 146, and galvanic isolator 655 may be an implementation of galvanic isolator 150. Lower phase gate driver 602 may be similar to upper phase gate driver 601, and, therefore, system 600 may be described with reference to upper phase gate driver 601.

PWM controller 603 may provide a PWM upper signal 605 to low voltage upper phase controller 620, and a PWM lower signal 606 to low voltage lower phase controller 625. Low voltage upper phase controller 620 may include an upper PWM comparator 611 and upper enable latch 616. Low voltage lower phase controller 625 may include a lower PWM comparator 641 and lower enable latch 646. An upper enable 681 output from upper enable latch 616 may be connected to an input of lower PWM comparator 641, and a lower enable 682 output from lower enable latch 646 may be connected to an input of upper PWM comparator 611.

Upper PWM comparator 611 may be an AND gate, for example, and may assert an output high when both PWM upper signal 605 and lower enable 682 signals are high. The output high from upper PWM comparator 611 may reset upper enable latch 616 to assert upper enable 681 to a low state, and thereby prevent lower PWM comparator 641 from asserting a high output. Lower PWM comparator 641 may be an AND gate, for example, and may assert an output high when both PWM lower signal 606 and upper enable 681 signals are high. The output high from lower PWM comparator 641 may reset lower enable latch 646 to assert lower enable 682 to a low state, and thereby prevent upper PWM comparator 611 from asserting a high output.

Low voltage upper phase controller 620 may include upper PWM comparator 611, LV pulse generator 612, LV inverter 612A, first LV transmitter 613A, second LV transmitter 613B, LV receiver 614, LV demodulator 615, upper enable latch 616, roundtrip timer 617, and overlap comparator 618. LV pulse generator 612 may generate a pulse stream when output of upper PWM comparator 611 is high. First LV transmitter 613A may transmit the pulse stream from LV pulse generator 612 over galvanic isolator 650. LV inverter 612A may invert the pulse stream from LV pulse generator 612, and second LV transmitter 613B may transmit the inverted pulse stream over galvanic isolator 650. Here, the inverted pulse stream is a duplicate of the original pulse stream, but in an inverted form. LV receiver 614 may receive a transmission from galvanic isolator 650. LV demodulator 615 may demodulate the received transmission as an input to set upper enable latch 616.

High voltage upper phase controller 630 may include HV receiver 671, HV demodulator 672, HV off-state detector 673, HV pulse generator 674, HV inverter 674A, first HV transmitter 675A, and second HV transmitter 675B. HV receiver 671 may receive a transmission from galvanic isolator 650. HV demodulator 672 may demodulate the received transmission as an input to upper phase switch 644. HV off-state detector 673 may detect when upper phase switch 644 transitions from on-state to off-state. HV pulse generator 674 may generate a pulse burst when an output of HV off-state detector 673 is high. First HV transmitter 675A may transmit the pulse burst from HV pulse generator 674 over galvanic isolator 650. HV inverter 674A may invert the pulse burst from HV pulse generator 674, and second HV transmitter 675B may transmit the inverted pulse burst over galvanic isolator 650 to LV receiver 614.

System 600 may operate as described below with reference to FIG. 6 and FIG. 7. At initialization (i.e. far left of waveform diagram 700), PWM upper signal 605 and PWM lower signal 606 may both be logic low, and upper phase switch 644 and lower phase switch 648 may both be in the off-state, as indicated by upper PWM signal 705 (from PWM upper signal 605) and lower PWM signal 725 (from PWM lower signal 606) both being low, and by upper FET off signal 715 (from HV off-state detector 673) and lower FET off signal 735 (from lower phase off-state detector) both being logic high. At initialization, upper FET out signal 720 (from upper enable 681) and lower FET out signal 740 (from lower enable 682) are both logic high.

Here, upper PWM comparator 611 and lower PWM comparator 641 each have a logic high input from lower enable latch 646 and upper enable latch 616 respectively, and have a logic low input from PWM upper signal 605 and PWM lower signal 606, respectively. This state allows for either the upper phase switch 644 or lower phase switch 648 to be commanded on via a PWM logic high state.

At the beginning of period 760, lower PWM signal 725 changes from logic low to logic high, and upper PWM signal 705 remains logic low. Lower PWM comparator 641 compares the logic high from lower PWM signal 725 and the logic high from upper FET out signal 720 and asserts an output signal high, which causes the lower LV pulse generator to generate lower pulses 730, which travel upstream from low voltage lower phase controller 625 to high voltage lower phase controller 635 through galvanic isolator 655. Concurrently, the output signal high at the output of lower PWM comparator 641 resets lower enable latch 646 so that lower FET out signal 740 (lower enable 682) is set to a logic low state (logic 0). A logic low state of lower FET out signal 740 (lower enable 682) immediately places a logic 0 at the input to upper PWM comparator 611, which prevents a logic high state on the upper PWM signal 705 (PWM upper signal 605) from being passed through upper PWM comparator 611. This prevention assures that upper phase switch 644 is held in an off-state.

Meanwhile, high voltage lower phase controller 635 receives the lower pulses 730 and converts the pulses into a logic high signal with HV demodulator, which drives the lower phase switch 648 to the on-state as indicated by a rising edge on the lower FET off signal 735. At the beginning of period 765, lower PWM signal 725 transitions to a low state. The output of lower PWM comparator 641 is now logic low and low voltage lower phase controller 625 stops sending lower pulses 730 to high voltage lower phase controller 635. The lack of pulses across galvanic isolator 655 is detected by the high voltage lower phase controller 635, the demodulated output transitions to logic low, and commands lower phase switch 648 off.

HV off-state detector 673 detects the active state of upper phase switch 644 (and the HV off-state detector of lower phase gate driver 602 similarly detects the active state of lower phase switch 648). HV off-state detector 673 may use one or more different methods to determine the active state of upper phase switch 644. One example would be to measure the gate to source voltage of upper phase switch 644, if the upper phase switch 644 is a FET, as drawn in the example shown in FIG. 6. One example would be to measure the switch gate to emitter voltage, if upper phase switch 644 is an IGBT. One example would be to measure the magnitude and/or direction of current flow through the upper phase switch 644 by measuring the voltage drop across a series resistances placed between the switch output and the phase 690, or by measuring a representative percentage of the switch current using a parallel switch, for example.

As shown in FIG. 7, following the logic low state of lower PWM signal 725 and lower pulses 730, lower FET off signal 735 shows a transition from a logic low state to a logic high state, which occurs when HV off-state detector determines that the lower phase switch 648 has successfully transitioned to the off-state. HV pulse generator responds to the rising edge of the off-state detector signal 735 by asserting a short burst of pulses (see "FET off signal" in lower pulses 730) downstream from high voltage lower phase controller 635 through the galvanic isolator 655 to low voltage lower phase controller 625. The pulse burst is deliberately finite in duration and is not a continuous pulse stream. The duration of the pulse burst is long enough that the pulse burst may be detected by low voltage lower phase controller 625. A typical pulse burst duration may be from approximately 100 nS to approximately 300 nS.

The downstream short pulse burst in lower pulses 730 is demodulated by LV demodulator, which asserts a logic high output to set lower enable latch 646 to assert lower FET out signal 740 to a logic high, as illustrated in period 765. A logic high on lower enable 682 is input to upper PWM comparator 611. Upper phase switch 644 is now enabled for use due to a successful closed-loop response of the lower phase switch 648 to a command-off cycle, as indicated by the long arrow from the lower FET out signal 740 to the upper PWM signal 705 to begin period 770. The roundtrip timer records and stores the time between the output of lower PWM comparator 641 transitioning to a logic low (i.e. following transition of lower PWM signal 725 to logic low at the beginning of period 765) to the time when lower enable 682 is asserted to logic high (i.e. transition of lower FET out signal 740 to logic high near the end of period 765).

The operation of the upper phase gate driver 601 is identical to the operation of the lower phase gate driver 602.

At the end of period 765, PWM upper signal 605 and PWM lower signal 606 may both be logic low, and upper phase switch 644 and lower phase switch 648 may both be in the off-state, as indicated by upper PWM signal 705 (from PWM upper signal 605) and lower PWM signal 725 (from PWM lower signal 606) both being low, and by upper FET off signal 715 (from HV off-state detector 673) and lower FET off signal 735 (from lower phase off-state detector) both being logic high. At the end of period 765, upper FET out signal 720 (from upper enable 681) and lower FET out signal 740 (from lower enable 682) are both logic high.

Here, upper PWM comparator 611 and lower PWM comparator 641 each have a logic high input from lower enable latch 646 and upper enable latch 616 respectively, and have a logic low input from PWM upper signal 605 and PWM lower signal 606, respectively. This state allows for either the upper phase switch 644 or lower phase switch 648 to be commanded on via a PWM logic high state.

At the beginning of period 770, upper PWM signal 705 changes from logic low to logic high, and lower PWM signal 725 remains logic low. Upper PWM comparator 611 compares the logic high from upper PWM signal 705 and the logic high from lower FET out signal 740 and, based on the comparison, asserts an output signal high, which causes the LV pulse generator 612 to generate upper pulses 710, which travel upstream from low voltage upper phase controller 620 to high voltage upper phase controller 630 through galvanic isolator 650. More specifically, LV pulse generator 612 receives the output signal high from upper PWM comparator 611 and generates upper pulses 710. First LV transmitter 613A and second LV transmitter 613B send upper pulses 710 and inverted pulses (from LV inverter 612A) through galvanic isolator 650 to HV receiver 671.

Concurrently, the output signal high at the output of upper PWM comparator 611 resets upper enable latch 616 so that upper FET out signal 720 (upper enable 681) is set to a logic low state (logic 0). A logic low state of upper FET out signal 720 (upper enable 681) immediately places a logic 0 at the input to lower PWM comparator 641, which prevents a logic high state on the lower PWM signal 725 (PWM lower signal 606) from being passed through lower PWM comparator 641. This prevention assures that lower phase switch 648 is held in an off-state.

Meanwhile, HV receiver 671 of high voltage upper phase controller 630 receives the upper pulses 710 and converts the pulses into a logic high signal with HV demodulator 672, which drives the upper phase switch 644 to the on-state, as indicated by a falling edge on upper FET off signal 715. At the beginning of period 775, upper PWM signal 705 transitions to a low state. The output of upper PWM comparator 611 is now logic low and LV pulse generator 612 stops sending upper pulses 710 to high voltage upper phase controller 630. The lack of pulses across galvanic isolator 650 is detected by HV receiver 671 of high voltage upper phase controller 630, the demodulated output of HV demodulator 672 transitions to logic low, and commands upper phase switch 644 off.

As shown in FIG. 7, following the transition to a logic low state of upper PWM signal 705 and upper pulses 710, upper FET off signal 715 shows a transition from a logic low state to a logic high state, which occurs when HV off-state detector 673 determines that the upper phase switch 644 has successfully transitioned to the off-state. HV pulse generator 674 responds to the successful switch transition to the off-state from HV off-state detector 673 by asserting a short burst of pulses (see "FET off signal" in upper pulses 710) downstream from high voltage upper phase controller 630 through the galvanic isolator 650 to low voltage upper phase controller 620. More specifically, first HV transmitter 675A and second HV transmitter 675B send upper pulses 710 and inverted pulses (from HV inverter 674A) through galvanic isolator 650 to LV receiver 614. The pulse burst is deliberately finite in duration and is not a continuous pulse stream. The duration of the pulse burst is long enough that the pulse burst may be detected by LV receiver 614. A typical pulse burst duration may be from approximately 100 nS to approximately 300 nS.

The downstream short pulse burst is demodulated by LV demodulator 615, which asserts a logic high output to set upper enable latch 616 to assert upper FET out signal 720 to a logic high, as illustrated in period 775. A logic high on upper enable 681 is input to lower PWM comparator 641. Lower phase switch 648 is now enabled for use due to a successful closed-loop response of the upper phase switch 644 to a command off cycle, as indicated by the short arrow from the upper FET out signal 720 to the lower PWM signal 725 to end period 775. Roundtrip timer 617 records and stores the time between the output of upper PWM comparator 611 transitioning to a logic low (i.e. following transition of upper PWM signal 705 to logic low at the beginning of period 775) to the time when upper enable 681 is asserted to logic high (i.e. transition of upper FET out signal 720 to logic high near the end of period 775).

Period 760 "on" and period 765 "Non-overlap" may be associated with the on-state and off-state of lower phase switch 648, respectively. Period 770 "on" and period 775 "Non-overlap" may be associated with the on-state and off-state of upper phase switch 644, respectively. For lower phase switch 648, "Non-overlap" may refer to a period of time after lower PWM signal 725 transitions to logic low that is reserved for the lower phase switch 648 to successfully turn off prior to the assertion of upper PWM signal 705 to a logic high. For upper phase switch 644, "Non-overlap" may refer to a period of time after upper PWM signal 705 transitions to logic low that is reserved for the upper phase switch 644 to successfully turn off prior to the assertion of lower PWM signal 725 to a logic high.

As shown in FIG. 6, PWM controller 603, which generates upper PWM signal 705 and lower PWM signal 725, may not directly observe upper enable 681 and lower enable 682. However, the disclosure is not limited thereto, and one or more signals from low voltage upper phase controller 620 and low voltage lower phase controller 625 may be sent to PWM controller 603, so that decisions by PWM controller 603 regarding PWM logic states may be processed based on one or more signals from low voltage upper phase controller 620 and low voltage lower phase controller 625, such as to inform the PWM controller 603 that a non-overlap violation has occurred and that asserted command-on signals from the PWM controller 603 have been delayed or prevented. Such information may allow the PWM controller 603 to take corrective action.

Scenarios for non-overlap enforcement and response to non-overlap violations are discussed below to further explain one or more embodiments. The below cases 1-6 are similar when applied to either upper phase gate driver 601 or lower phase gate driver 602.

Case 1: A non-overlap time is a fixed time that is determined by the PWM controller 603, and which is longer than the absolute worst case feedback loop time and non-overlap violations never occur. Here, the lower FET out signal 740 is asserted to a logic high prior to the PWM controller 603 asserting the upper PWM signal 705 logic high. The upper FET out signal 720 is asserted to a logic high prior to the PWM controller 603 asserting the lower PWM signal 725 logic high.

Case 2: The same as Case 1, except that the lower roundtrip time for a command off event exceeds the fixed non-overlap time determined by PWM controller 603 in case 1. Here, the lower FET out signal 740 is logic low when the upper PWM signal 705 reaches logic high. Overlap comparator 618 records a non-overlap violation and uses a timer to determine the duration of the non-overlap violation. Lower phase switch 648 reaches command off and lower FET out signal 740 is set to logic high. The upper PWM signal 705 is logic high and the lower FET out signal 740 is logic high. The upper PWM signal 705 is sent to upper phase switch 644, having been delayed by the non-overlap violation time. The non-overlap violation timer records the non-overlap violation time for diagnostic analysis.

Case 3: The same as Case 2, except that the output of the overlap comparator 618 is routed to PWM controller 603, which is immediately notified that a non-overlap violation has occurred.

Case 4: the same as Case 2, except that lower FET out signal 740 is routed to PWM controller 603, which can then immediately see if a non-overlap violation will occur prior to asserting upper PWM signal 705 to a high state.

Case 5: upper FET out signal 720 and lower FET out signal 740 are both logic high, and upper PWM signal 705 and lower PWM signal 725 are both logic low, such that either upper phase switch 644 or lower phase switch 648 can be turned on, followed by upper PWM signal 705 and lower PWM signal 725 being set to logic high simultaneously due to a fault in system 600. Here, upper FET out signal 720 and lower FET out signal 740 are in a race condition, where one of the signals will assert to a logic high prior to the other, due to variation within the components of system 600. The first of the upper FET out signal 720 and lower FET out signal 740 to reach logic high will clear the associated latch. The first latch to clear to 0 will feed the logic 0 back to the opposing PWM comparator (upper PWM comparator 611 or lower PWM comparator 641). The presence of a logic 0 at the input of the opposing PWM comparator will force the PWM comparator output to logic low. The possibility exists that the opposing PWM comparator output may have briefly reached a logic high state due to the race condition, but this period of time will be very brief and will be followed by a logic low condition. The result of the above operation is that the race condition will resolve to one switch (upper phase switch 644 or lower phase switch 648) being enabled to be commanded on and the opposing switch to be blocked from being commanded on. Non-overlap protection has been successfully demonstrated in the worst-case condition of simultaneous assertion of PWM upper signal 605 and PWM lower signal 606.

Case 6: The same as Case 5 except that the upper PWM signal 705 high assertion occurs before or after the lower PWM signal 725 high assertion. This case will resolve itself such that the first side to assert a PWM logic high will block the opposing side from being commanded on.

As described above, one or more embodiments may provide a closed-loop feedback system using one galvanic isolation channel in order to eliminate the added cost and defect-related failure mechanisms associated with two galvanic isolation channels. One or more embodiments may address the problems of open-loop non-overlap enforcement and the problems of two-channel closed-loop non-overlap enforcement. One or more embodiments may communicate the off-state status of the switch using the galvanic command channel at a point in time when the channel is no longer communicating a command on-state, and may communicate the off-state status of the switch using a burst of galvanic pulses which persist only long enough to communicate that a successful off-state has been reached. One or more embodiments may include a roundtrip timer. One or more embodiments may include a non-overlap detector. One or more embodiments may include one fewer galvanic channel per switch than some designs. For example, for a three-phase inverter that uses six switch channels, one or more embodiments may save six total galvanic channels compared to some designs. Each galvanic channel may require area within the integrated circuit or may require external components to implement, and thus one or more embodiments may be less expensive and have a lower probability of defect-related failures than some designs. One or more embodiments may include active non-overlap violation detection and roundtrip timer diagnostics, which are advantages over some designs. One or more embodiments may provide closed-loop feedback that is useful for preventing shoot-through events by requiring that confirmation of a switch off-state is required to enable the command on of the opposing switch. One or more embodiments may be optimally designed to use a single burst of downstream galvanic data through the available command channel to indicate that a successful off-state of a switch has been reached to enable the command on of the opposing switch. One or more embodiments may provide a closed loop non-overlap enforcement architecture that ensures that an on-state phase switch is off prior to allowing a complementary off-state phase switch to turn on. One or more embodiments may support a minimum off time or minimum non-overlap time of approximately 1 µS. One or more embodiments may provide closed loop feedback with one galvanic channel.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
an inverter configured to convert DC power from a battery to AC power to drive a motor, wherein the inverter includes:
  a first galvanic interface configured to separate a first high voltage area from a low voltage area;
  a first low voltage controller in the low voltage area, the first low voltage controller configured to receive a first PWM signal from a PWM controller, and send a first control signal using the first galvanic interface to a first high voltage controller in the first high voltage area based on the first PWM signal;
  a second galvanic interface configured to separate a second high voltage area from the low voltage area; and
  a second low voltage controller in the low voltage area, the first low voltage controller configured to receive a second PWM signal from the PWM controller, and send a second control signal using the second galvanic interface to a second high voltage controller in the second high voltage area based on the second PWM signal, wherein the second low voltage controller is configured to provide an output latch signal to the first low voltage controller and receive an input latch signal from the first low voltage controller, and wherein the output latch signal is based on the second PWM signal and the input latch signal.

2. The system of claim 1, wherein the first low voltage controller is further configured to receive a feedback signal over the first galvanic interface from the first high voltage controller, and wherein the input latch signal is based on the first PWM signal, the output latch signal, and the feedback signal.

3. The system of claim 2, wherein the first low voltage controller is configured to send the first control signal using a set of communication lines of the first galvanic interface and receive the feedback signal using the set of communication lines in the first galvanic interface.

4. The system of claim 2, wherein the first control signal is configured to control a phase switch of an inverter, and the feedback signal is configured to indicate an off-state of the phase switch.

5. The system of claim 2, wherein the first low voltage controller is configured to record a time based on the first PWM signal and the feedback signal.

6. The system of claim 1, wherein the first low voltage controller is configured to generate a fault based on the first PWM signal and the output latch signal.

7. The system of claim 1, wherein the output latch signal and the input latch signal enable the first PWM signal in the first low voltage controller and the second PWM signal in the second low voltage controller, respectively.

8. The system of claim 1, further comprising:
the battery configured to supply the DC power to the inverter; and
the motor configured to receive the AC power from the inverter to drive the motor.

9. A system comprising:
a high voltage controller configured to be in a high voltage area separated from a low voltage area by a galvanic interface including a command channel and a message channel, the high voltage controller configured to receive a control signal from a low voltage controller in the low voltage area using the command channel of the galvanic interface, control a phase switch based on the control signal, and send a switch state signal to the low voltage controller using the command channel of the galvanic interface,
wherein the high voltage controller is configured to control the switch state signal based on a state of the phase switch.

10. The system of claim 9, wherein the high voltage controller is configured to send the switch state signal using the command channel of the galvanic interface when the high voltage controller is not receiving the control signal from the command channel of the galvanic interface.

11. The system of claim 9, wherein the high voltage controller is configured to send the switch state signal by sending a burst of galvanic pulses on the command channel of the galvanic interface.

12. The system of claim 9, wherein the high voltage controller includes one or more point-of-use controllers on a power module with the phase switch.

13. The system of claim 9, wherein the high voltage controller is configured to send the control signal to one or more point-of-use controllers on a power module with the phase switch, and receive the switch state signal from the one or more point-of-use controllers.

14. The system of claim 9, wherein the high voltage controller is further configured to invert the switch state signal, and send the switch state signal and the inverted switch state signal to the low voltage controller using the command channel of the galvanic interface.

15. A system including:
a galvanic interface configured to separate a high voltage area from a low voltage area;
a low voltage controller in the low voltage area, the low voltage controller including:
a PWM comparator configured to receive a PWM signal and an input latch signal, and generate a PWM comparator signal based on a comparison of the PWM signal and the input latch signal,
a low voltage pulse generator configured to generate an upstream pulse based on the PWM comparator signal,
a low voltage transmitter configured to send the upstream pulse to the galvanic interface,
a low voltage receiver configured to receive a downstream pulse from the galvanic interface,
a low voltage demodulator configured to generate a low voltage demodulated signal based on the downstream pulse, and
an enable latch configured to be set with the low voltage demodulated signal and to be reset with the PWM comparator signal, the enable latch further configured to provide an output latch signal; and
a high voltage controller in the high voltage area, the high voltage controller including:
a high voltage receiver configured to receive the upstream pulse from the galvanic interface,
a high voltage demodulator configured to generate a high voltage demodulated signal based on the upstream pulse, the high voltage demodulated signal configured to control a phase switch,
a high voltage off-state detector configured to detect an off-state of the phase switch,
a high voltage pulse generator configured to generate the downstream pulse based on the detected off-state of the phase switch, and
a high voltage transmitter configured to send the downstream pulse to the galvanic interface.

16. The system of claim 15, wherein the high voltage controller includes one or more point-of-use controllers on a power module with the phase switch.

17. The system of claim 15, wherein the low voltage controller further includes:
a roundtrip timer configured to record a time from when the PWM signal changes to a logic low to when the output latch signal changes to a logic high.

18. The system of claim 15, wherein the low voltage controller further includes:
an overlap comparator configured to generate a fault when the PWM signal is a logic high and the input latch signal is a logic low.

19. The system of claim 15, wherein the high voltage controller further includes:

a high voltage inverter configured to invert the downstream pulse to the high voltage transmitter.

20. The system of claim 15, wherein the low voltage controller further includes:
a low voltage inverter configured to invert the upstream pulse to the low voltage transmitter.

\* \* \* \* \*

UNITED STATES PATENT AND TRADEMARK OFFICE
CERTIFICATE OF CORRECTION

Page 1 of 1

PATENT NO. : 12,194,870 B2
APPLICATION NO. : 18/163381
DATED : January 14, 2025
INVENTOR(S) : Jack Lavern Glenn It is certified that error appears in the above-identified patent and that said Letters Patent is hereby corrected as shown below:

On the Title Page

Item (71), delete "Delphi Technologies IP Limited, St. Michael (BB)" and insert --BorgWarner US Technologies LLC, Wilmington, DE (US)--.

Item (73), delete "Borg Warner US Technologies LLC" and insert --BorgWarner US Technologies LLC--.

Signed and Sealed this
Twenty-fifth Day of February, 2025

Coke Morgan Stewart
*Acting Director of the United States Patent and Trademark Office*